United States Patent
Norstrom et al.

[11] Patent Number: 6,100,133
[45] Date of Patent: Aug. 8, 2000

[54] CAPACITORS IN INTEGRATED CIRCUITS

[75] Inventors: Hans Norstrom, Solna; Stefan Nygren, Uppsala, both of Sweden

[73] Assignee: Telefonaktiebolaget LM Ericsson, Stockholm, Sweden

[21] Appl. No.: 09/174,417

[22] Filed: Oct. 19, 1998

Related U.S. Application Data

[62] Division of application No. 09/066,814, Apr. 28, 1998.

[30] Foreign Application Priority Data

Apr. 29, 1997 [SE] Sweden .................................. 9701618

[51] Int. Cl.[7] .............................................. H01L 21/8242
[52] U.S. Cl. ......................... 438/250; 438/239; 438/240; 438/393
[58] Field of Search .................................... 438/171, 190, 438/238, 239, 240, 241, 250, 256, 254, 329, 381, 393, 396, 399, 397, 957; 257/535

[56] References Cited

U.S. PATENT DOCUMENTS

| | | | |
|---|---|---|---|
| 4,481,283 | 11/1984 | Kerr et al. | 430/319 |
| 4,997,794 | 3/1991 | Josquin et al. | 438/476 |
| 5,406,447 | 4/1995 | Miyazaki | 301/313 |
| 5,554,565 | 9/1996 | Liaw et al. | 438/233 |
| 5,563,762 | 10/1996 | Leung et al. | 361/301.4 |
| 5,627,391 | 5/1997 | Shimada | 257/310 |
| 5,851,870 | 12/1998 | Alugbin et al. | 438/239 |

FOREIGN PATENT DOCUMENTS

| | | |
|---|---|---|
| 0635891 | 1/1995 | European Pat. Off. . |
| 0735595 | 2/1996 | European Pat. Off. . |
| 3-203261 | 4/1991 | Japan . |

*Primary Examiner*—Carl Whitehead, Jr.
*Assistant Examiner*—Jeff Vockrodt

[57] ABSTRACT

The present invention relates to a method for, in the manufacturing of an integrated circuit, producing a capacitor with metallic conducting electrodes and to the capacitor itself and to the integrated circuit, which preferably are intended for high-frequency applications. According to the invention, a lower electrode (17,63,67) is produced through depositing a first metal layer (15) onto a layer structure (11) comprising lowermost a substrate and uppermost an insulating layer (13). An insulating layer (19) is deposited over the first metal layer (15), whereafter an electrical connection (25) to the lower electrode (17,63,67) is produced by etching a via hole (21) through the insulating layer (19), which via hole (21) is plugged. Thereafter the first metal layer (15) is uncovered within a predetermined area (33), whereafter a dielectric layer (35) is deposited, patterned and etched in such a way that it overlaps (39) a portion of the second insulating layer (19). Finally, an upper electrode (47,63,67) and a connecting layer (43) are produced through a second metal layer (41) being deposited on the structure (40) achieved thereby, which second metal layer (41) is patterned and etched in such a way that the upper electrode (47,63,67) overlaps (49) the second insulating layer (19) and the connecting layer (43) overlaps the plugged via hole (21).

18 Claims, 4 Drawing Sheets

CAPACITORS IN INTEGRATED CIRCUITS

This application is a divisional of copending application Ser. No. 09/066,814, filed on Apr. 28, 1998, pending the entire contents of which are hereby incorporated by reference.

FIELD OF THE INVENTION

The present invention relates to a method for, during the manufacturing of an integrated circuit, producing a capacitor with metallic conducting electrodes and the capacitor itself and the integrated circuit. The capacitor, respectively the integrated circuit, is preferably intended for high-frequency applications.

BACKGROUND OF THE INVENTION

During the manufacturing of a capacitor in an integrated circuit an electrically conducting layer is deposited on a layer structure comprising a silicon substrate upon which a thin thermal oxide is grown and in which layer structure active and passive components are defined in a standard way. On this electrically conducting layer, which forms the lower electrode of the capacitor, an electrically insulating layer is then deposited. According to known techniques the electrically insulating layer is patterned and etched in predetermined regions, on the one hand, for electrical connection to the lower electrode of the capacitor and, on the other hand, for the manufacturing of the capacitor itself. This is performed in a single step. A thin dielectric of silicon oxide or silicon nitride is deposited, patterned and etched except for that over the lower electrode. Subsequently, an upper metal layer is deposited, which is patterned and etched to form the upper electrode of the capacitor and the electrical connection to the lower electrode of the capacitor.

With this technique there is, however, the risk present that contact problems occur at the electrical connection, for example because of bad step coverage for the metal. Therefore the electrical connection must be produced with relatively large cross-sectional area. In order to achieve large capacitance values the capacitor must have a large area or extremely small dielectric thickness. In the first case there is a risk for deformations caused by mechanical stresses and in the second case the capacitor becomes unreliable as there is a risk of breakdown present.

It is known from i.a. U.S. Pat. No. 5,406,447 and U.S. Pat. No. 5,563,762 to use capacitor dielectrics of other materials, such as ferroelectric material, e.g. PZT ($PbZr_xTi_{1-x}O_3$), which has an extremely high dielectric number. In this case neither the area of the capacitor nor its thickness are critical. However, a completely different manufacturing technique is required because of, among other things, the high crystallization temperature of the capacitor dielectric, interdiffusion between the electrodes and the capacitor dielectric and a large sensitivity to impurities.

SUMMARY OF THE INVENTION

One object of the present invention is to provide a compact and reliable capacitor with a capacitor dielectric of conventional material, such as silicon oxide or silicon nitride, and which capacitor shall have a high performance and be intended for use in an integrated circuit, especially in an integrated circuit for high-frequency applications in, for example, the radio field.

A further object of the invention is to provide a capacitor with an electrically connected conductor having a small cross-section area and a high reliability connected to the lower electrode of the capacitor.

Yet one object of the invention is to provide a capacitor without one or more of the problems which can occur with capacitors according to known techniques.

Yet another object of the invention is to provide a reliable and uncomplicated manufacturing method for a capacitor with said characteristics.

More objects of the present invention will appear in the description below.

In this respect the invention uses plugged via holes in order to establish electrical contact between the lower electrode of the capacitor and a conducting surface lying above it. The making of the via hole and plugging, i.e. chemical deposition, preferably of tungsten, which gives a conformal step coverage, followed by etching, is in this case performed in separate steps which are different from the process steps for the etching of a capacitor opening and the forming of the upper electrode of the capacitor. When the integrated circuit contains a number of conducting layers, then the capacitor is preferably manufactured as high up as possible in the layer structure.

In more detail, a lower electrode is manufactured, according to the invention, through depositing a first metal layer on a layer structure comprising at the very bottom a substrate and at the very top an insulating layer. The metal layer is patterned lithographically and is etched in order to shape the lower electrode and the electrical connection to it. An insulating layer is deposited over the first metal layer, whereafter an electrical connection to the lower electrode is produced through etching a via hole through said insulating layer, which via hole is plugged. Thereafter, the first metal layer is exposed inside a predetermined area, whereafter a dielectric layer is deposited, which is patterned and etched in such a way that it overlaps said predetermined area. Finally, an upper electrode and a connection layer to the lower electrode are manufactured through a second metal layer being deposited on the structure thereby achieved, which is patterned and etched in such a way that the upper electrode overlaps said predetermined area and the connection layer overlaps the plugged via hole.

The electrodes are preferably produced in a limited size, e.g. 100×100 $\mu$m, which limits the capacity of the capacitor. If a higher capacitance is desired, several parallelly connected capacitors are produced through holes of predetermined shape being etched in predetermined positions in the upper and lower electrode which in this case are produced in larger sizes. The holes are preferably etched in such a way that the respective electrodes exist as connected together plates, e.g. of the size 100×100 $\mu$m.

Instead of using simple metal layers as electrodes, metal stacks can be used, such as three-layer laminates consisting of two thin electrically conducting layers of e.g. titanium nitride and a thick metal layer of e.g. aluminium lying between them.

A via barrier, for example consisting of a laminate of titanium and titanium nitride, can be deposited on the insulating layer and in the via hole before the plugging of the via hole is performed.

Deep ditches or so-called trenches filled with an electrically insulating or semi-insulating material, especially a silicon oxide or polysilicon, can be formed in the underlying substrate in such a way that the capacitive coupling of the capacitor to this is minimized. The trenches are in this connection produced at an early stage of the manufacturing process. They are made advantageously in a grid pattern under the capacitor and to a depth of the order of 5 $\mu$m.

By means of the present invention, a capacitor is achieved which very well fulfils the objects.

An advantage of the invention is that a reliable capacitor with low resistive losses, low voltage dependency and a high Q-value is achieved. In this respect the capacitor is very well suited to be integrated in a VCO (Voltage Controlled Oscillator), which in this case gets a high Q-value, a good frequency stability and low phase noise. If high capacitances are required, the electrode regions are enlarged, and holes etched in the electrode which increases the adhesion of the electrodes.

Further advantages include higher reliability, i.a. a reduced risk of hillocking and simplified patterning in the case when metal stacks are used and a more reliable tungsten plugging in the case when via barriers are used.

Yet another advantage of the invention is that a low parasitic coupling to the substrate is achieved, in particular if the capacitor is placed higher in the layer structure and the substrate comprises trenches which shield the capacitor.

BRIEF DESCRIPTION OF THE DRAWINGS

The invention is described in more detail below with reference to the accompanying drawings, which are intended only to illustrate the invention and therefore shall in no way limit the invention.

DETAILED DESCRIPTION OF PREFERRED EMBODIMENTS

Figure 1:
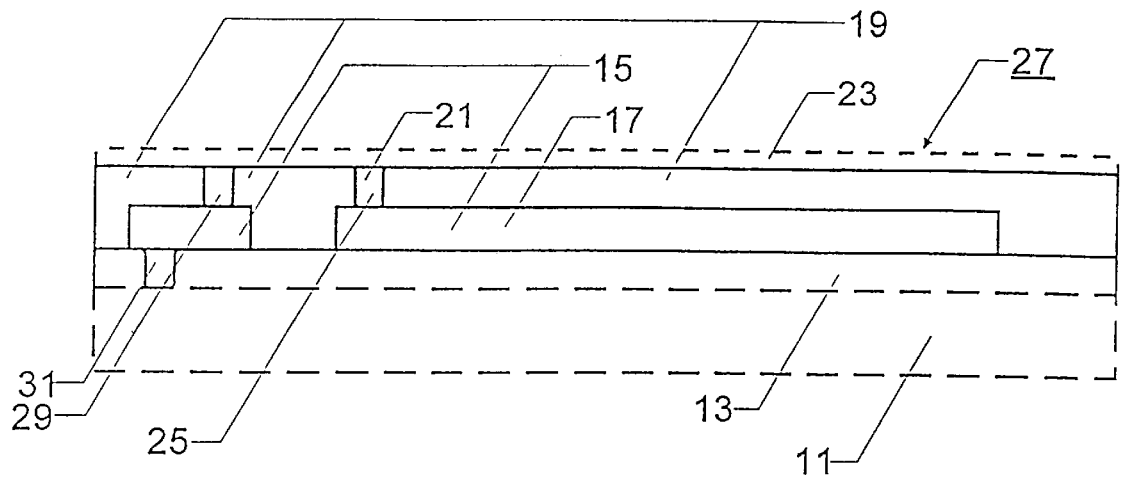
FIGS. 1–3 illustrate, in the form of cross-sectional views, a method for during the manufacturing of an integrated circuit producing a capacitor with metallic conducting electrodes in accordance with the present invention.

In FIG. 1, 11 indicates a substrate of preferably monocrystalline silicon and an arbitrary number of layers lying above it, a so-called multilayer structure. The layers are patterned and etched in accordance with a process scheme in order to obtain predetermined characteristics of the finished integrated circuit. A capacitor according to the invention comprised in the circuit, is produced preferably as high up in the layer structure as possible, for example, by using a third and a fourth metallic layer in the process as electrodes in the capacitor. This minimizes the effect of parasitic coupling to the substrate.

A metal layer 15, which preferably is the third layer of the layer structure, as mentioned above, is deposited according to the invention above the topmost silicon oxide layer 13 in the layer structure. This metal layer is patterned and etched in order to i.a. form a lower electrode 17.

After etching of the metal layer 15, an insulating layer 19 of e.g. silicon oxide is deposited, whereafter a contact hole or a so-called via hole 21 is defined by lithographic means. This contact hole 21 is plugged, e.g. with tungsten, which takes place by depositing a layer of tungsten 23 being deposited with CVD-technology, whereby conformal step coverage is insured. The tungsten layer 23 is deposited to a thickness which is greater than half of the width of the via hole. The via hole 21 is in this way filled completely and an evenly thick film is obtained over the insulating layer 19. The evenly thick tungsten layer 23 is etched, by means of e.g. a dry etch, so that the tungsten is only left remaining in the via hole 21. In this way an electrical connection or a so-called tungsten plug 25 to the lower electrode 17 is produced. The via hole 21 is produced with an extremely small diameter, preferably in the submicrometer range. The structure obtained in this way is shown in FIG. 1. In order that the tungsten plug shall function satisfactorily, it is advantageously preceded by the deposition of a titanium nitride layer in the via hole 21, which is described in more detail further on in the description.

Note that further tungsten plug via holes 29,31 are present both in the last deposited insulating layer 19 and in the earlier deposited silicon oxide layer 13.

This indicates only that other electrical connections and components could be produced parallel with the present capacitor.

Figure 2:
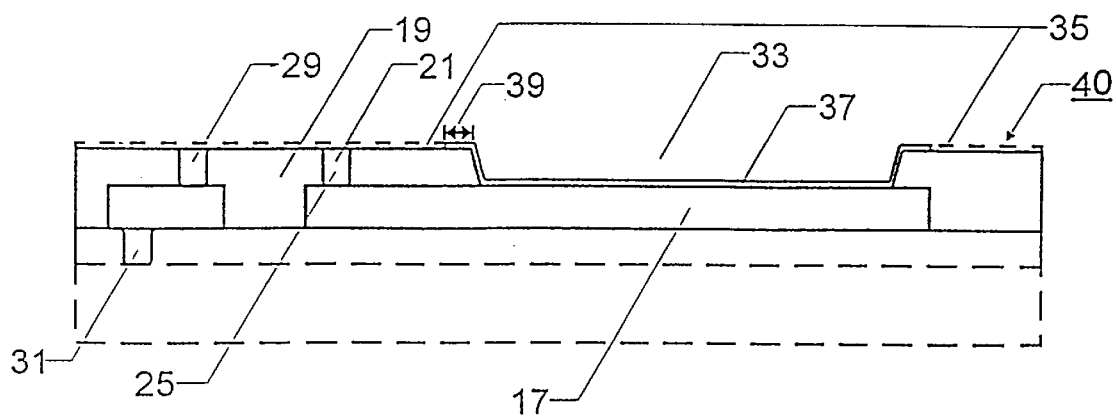

After etching back of the tungsten layer 23, a capacitor opening 33 is defined lithographically, see FIG. 2. The insulating layer 19 is removed by means of a dry etch in a predetermined area, i.e. the capacitor opening 33. The dry etch stops on the underlying metal, i.e. the capacitor plate 17, and is optimized with respect to the etching profile so that the subsequent deposition of dielectric and metal can be made with a good step coverage. Photoresist from the lithographic step is removed, whereafter a dielectric layer 35 is deposited, preferably with PECVD (Plasma Enhanced Chemical Vapor Deposition) technology over the structure. This layer 35, which also can be deposited with another technique such as e.g. CVD (Chemical Vapor Deposition) or SACVD (Sub Atmospheric Chemical Vapor Deposition) will form the capacitor dielectric 37.

The capacitor dielectric 37, which is to overlap 39 a portion of the second insulating layer 19 beyond the capacitor opening 33, is defined lithographically, whereafter the layer 35 outside the capacitor opening 33 is etched with dry etching and the photoresist removed. In particular, all the dielectric over the tungsten-plugged via hole 21, 29 must be removed. The resulting structure 40 is shown in FIG. 2.

The capacitor opening 33 should not be made larger than approximately 100×100 $\mu m^2$, otherwise there is a risk for a bad exchange as a consequence of mechanical stress. The overlap 39 should be approximately 1000 Å.

Figure 3:
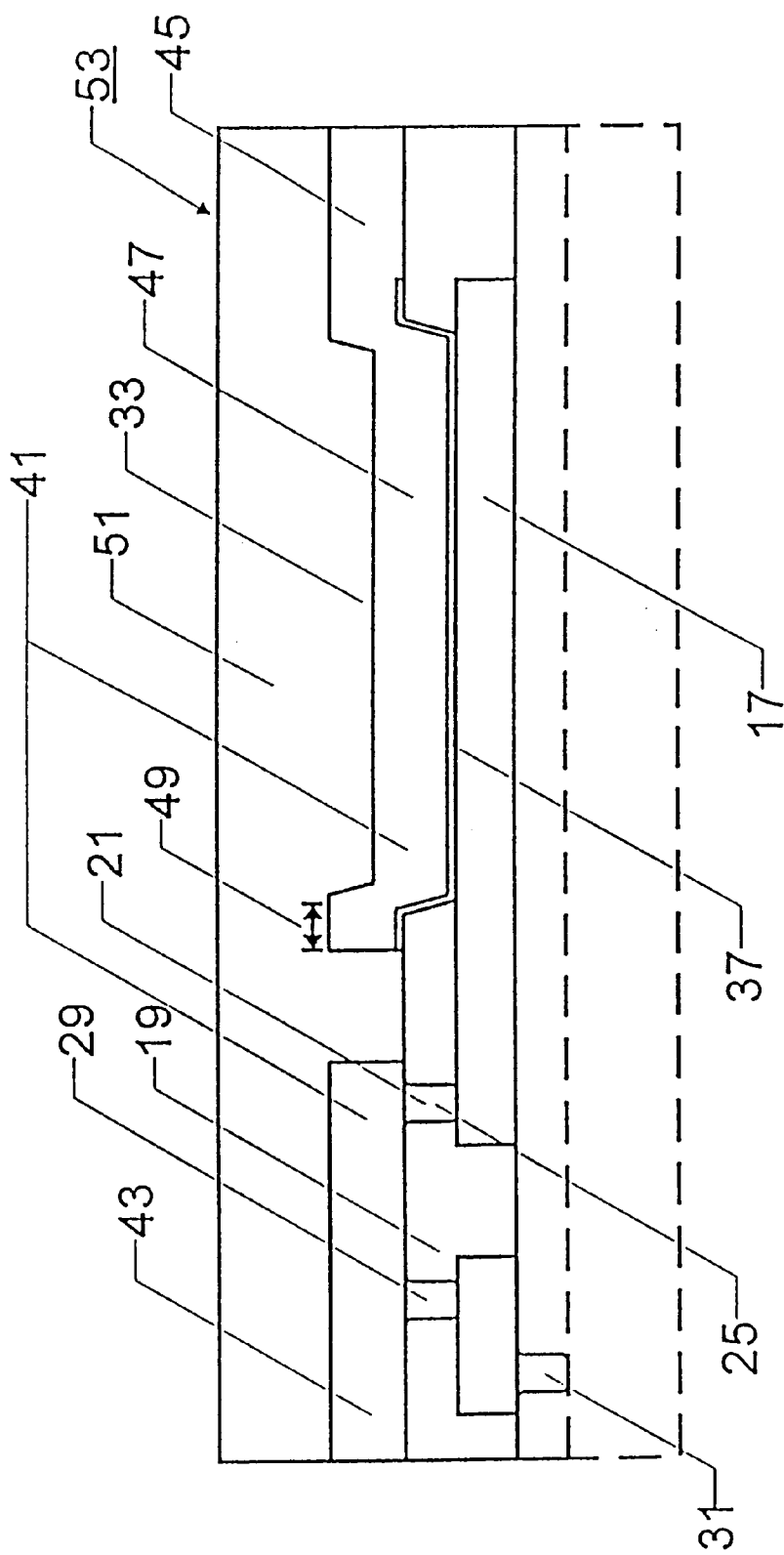

A fourth metal layer 41 is deposited, see FIG. 3. This layer 41 will serve as both a connecting layer 43, 45 and as the second, upper electrode 47 in the capacitor. The layer 41 is patterned and etched, whereafter the remaining photoresist is removed. The connecting layer 43 in this case connects the lower electrode 17 via the tungsten-plugged via hole 21. The upper electrode 47 is to overlap 49 the capacitor opening 33 in the same way as the capacitor dielectric 37 overlaps 39 the capacitor opening 33 and moreover connect to the connecting layer 45.

Finally, the circuit is passivated with, for example a two-layer structure 51 consisting of silicon oxide and silicon nitride. The structure 53 obtained in this way is shown in FIG. 3.

It is suitable to let both the electrode plates 17, 47 of the capacitor be made of e.g. aluminium or an aluminium copper alloy, in order to reduce the resistive losses and as capacitor dielectric 37 to use e.g. silicon nitride, which has a higher relative dielectric constant than silicon oxide. The metal layers 25, 41 are deposited via sputtering of the aluminium.

Note that the process steps (i) patterning and etching of the via holes 21, 29 and (ii) depositing and etching of the tungsten layer 23 are separated from the process steps (iii)

etching of the capacitor opening 33 and (iv) depositing of the metal layer 41 and etching of the upper electrode 47, and furthermore precede them. The reason for this is that the process steps for vias and capacitors must be able to be individually optimized with respect to e.g. etching profile and metal depositioning.

The capacitance C for a capacitor is given approximately by $$C=\epsilon_r\epsilon_0 A/t$$

where $\epsilon_r$ is the relative dielectric constant for the dielectric, t is its thickness, A is the area of the capacitor plates, and $\epsilon_0$ is the permetivity in vacuum.

As mentioned above, the capacitor plates 17, 47 should not be made bigger than approximately 100×100 μm, otherwise there is a risk present that the metal is released or buckles up from its foundation. Neither can the thickness t of the dielectric be less than approximately 300 Å, otherwise the risk is present for breakthrough owing to the surfaces being not perfectly flat. The relative dielectric constant $\epsilon_r$ is a material constant and is approximately 3,9 for silicon oxide and approximately 7,8 for silicon nitride. To use other dielectric materials is possible but requires access to a plurality of non-standard process stages.

Figure 4A:
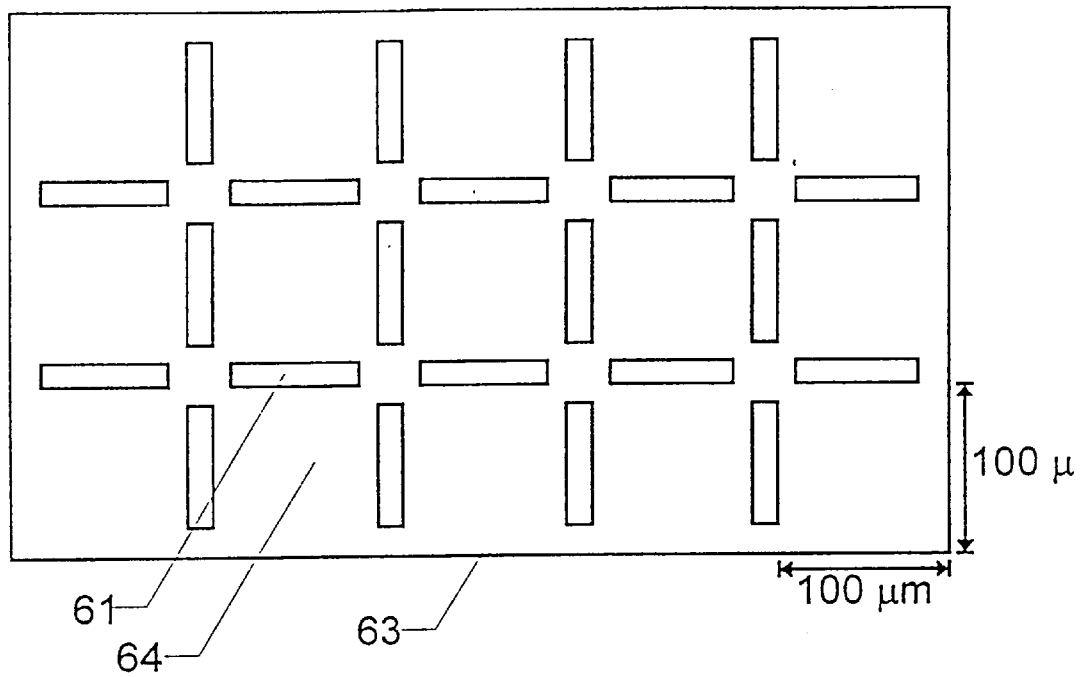
FIGS. 4a and 4b illustrate, seen from above, two different embodiments of electrodes comprised in a capacitor according to the invention.
Figure 4B:
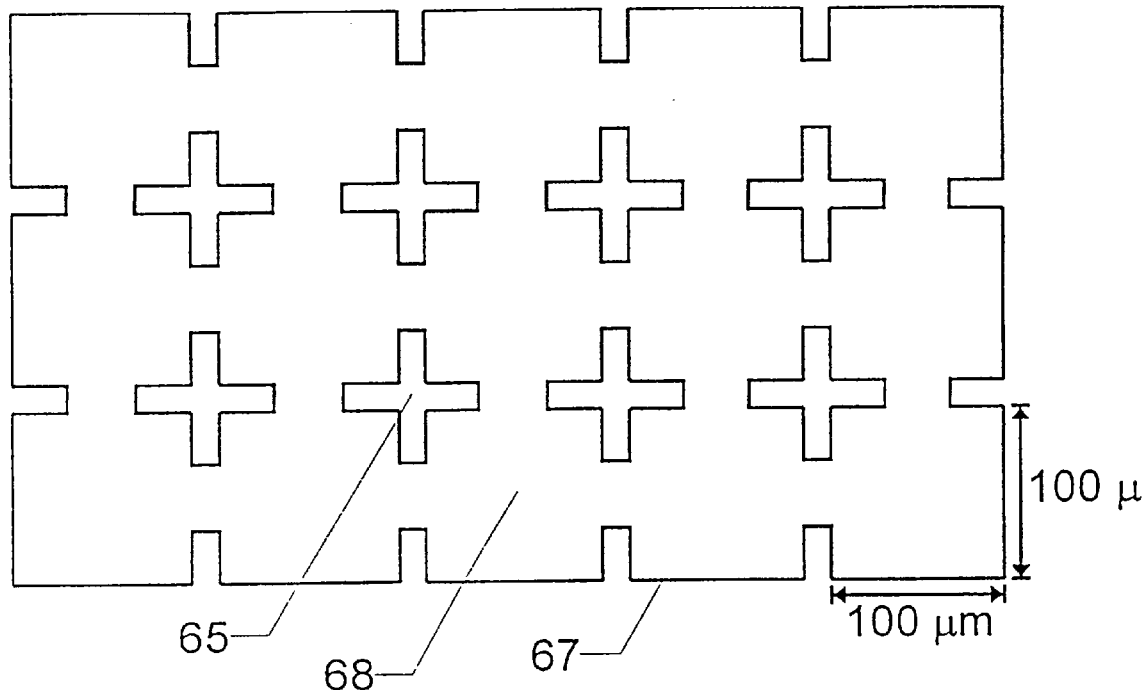

If higher capacitance values are desired, several capacitors—called cells here—are coupled together in parallel through patterning and etching of holes 61, 65 in the capacitor plates 63, 67 which in this case are manufactured in a larger size, see FIG. 4a–b. This patterning and etching advantageously occur parallelly with the shaping of the electrodes themselves 63, 67. The holes are then filled with oxide during deposition of the insulating layers 19, 51. In this way the capacitor plates will be, so to say, punched fast to their respective foundations, and the risk of, for example, buckling up of the metal, hillocking, is considerably reduced.

FIGS. 4a and 4b show, seen from above, two possible embodiments of capacitor plates during the parallel connection of several cells. Etching preferably is performed in such a way that the resulting capacitor plate 63, 67 appears as a number of joined together smaller plates 64, 68, the width of which amounts preferably to approximately 100 μm. In this way extremely large capacitor plates 63, 67 can be manufactured from a large number of smaller plates 64, 68 and consequently large capacitance values can be achieved.

Generally, patterning and etching can be performed which gives plates of any arbitrary shape, e.g. eight-sided or rectangular. It is, however, important that the size of the plates stays in the order of size of 100×100 $\mu m_2$.

In a further embodiment of the present invention, a via barrier 71,73 is deposited over the insulating layer 19. The via barrier 71,73 is preferably formed from a laminate 71,73 of titanium and titanium nitride, as is evident from FIG. 5. These layers are deposited by means of sputtering, after etching of the via hole 21 in the insulating layer 19, but before the plugging of the via hole 21.

In order to fulfil the requirement for good electrical contact and adhesion, a thin layer 71 of titanium is first deposited on the structure, i.e. on the upper side of the insulating layer 19 and on the walls and bottom of the via hole 21. A thin layer 73 of titanium nitride is then deposited above. The reason for this is that the titanium nitride is a suitable foundation for the chemical process, used for the deposition of tungsten, to function satisfactorily. The so-called via barrier 71,73 is thus preferably a double-layer structure with titanium at the bottom and titanium nitride upper-most.

Figure 5:
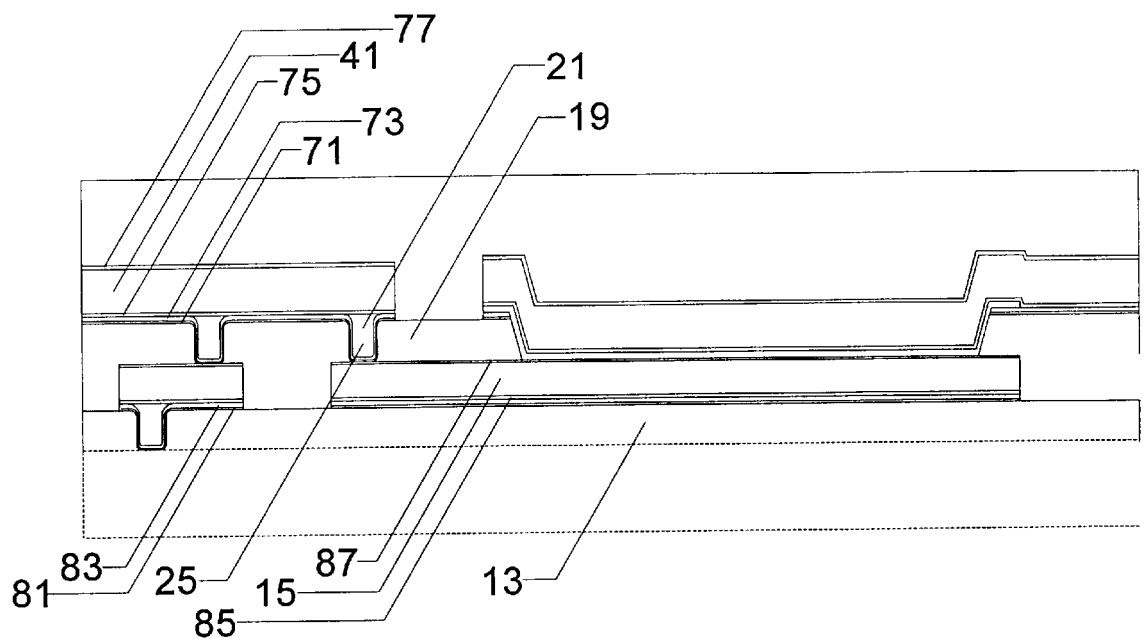
FIGS. 5 and 6 illustrate, in the form of cross-sectional view, further embodiments of a capacitor according to the invention.

Advantageously, a so-called metal stack 75, 41,77 is deposited instead of a metal layer 41 both for the shaping of the upper electrode and the connecting layers. This metal stack 75, 41,77, as shown in FIG. 5, is built up as a laminate with a thin titanium nitride layer 75 at the bottom followed by a thicker aluminium layer 41 and furthermore a thin titanium nitride layer uppermost 77. The aluminium layer 41 is the actual conductor while the titanium nitride layers 75,77 in a different way contribute to the reliability of the structure and facilitate the subsequent lithographic patterning through reduced reflection. The aluminium is naturally fully exchangeable for another electrically conducting material, e.g. an aluminium-copper alloy with 0,5–4% copper.

The desired electrodes and conductors are formed by patterning and etching of the whole metal stack 75, 41,77. Etching of the metal stack 75, 41,77 shall go through both the metal stack 75, 41,77 and the via barrier 71,73, which remains between the metal stack 75, 41,77, and the insulating layer 19.

The conductors consequently consist of—counting from the insulating layer 19 and upwardly, titanium 71, and titanium nitride 73 (the via barrier), followed by titanium nitride 75, aluminium 41, and furthermore titanium nitride 77 (the metal stack). The tungsten plug 25 is completely surrounded by the via barrier 71,73, apart from above, where it is directly connected to the metal stack 75, 41,77.

As shown in FIG. 5, a via barrier 81, 83 has also been deposited on the insulating silicon oxide layer 13 like a metal stack 85,15, 87 has been deposited instead of a metal layer 15 for shaping of the lower electrode. Preferably, via barriers are deposited over all the insulating layers in which via holes have been made and metal stacks instead of metal layers.

Figure 6:
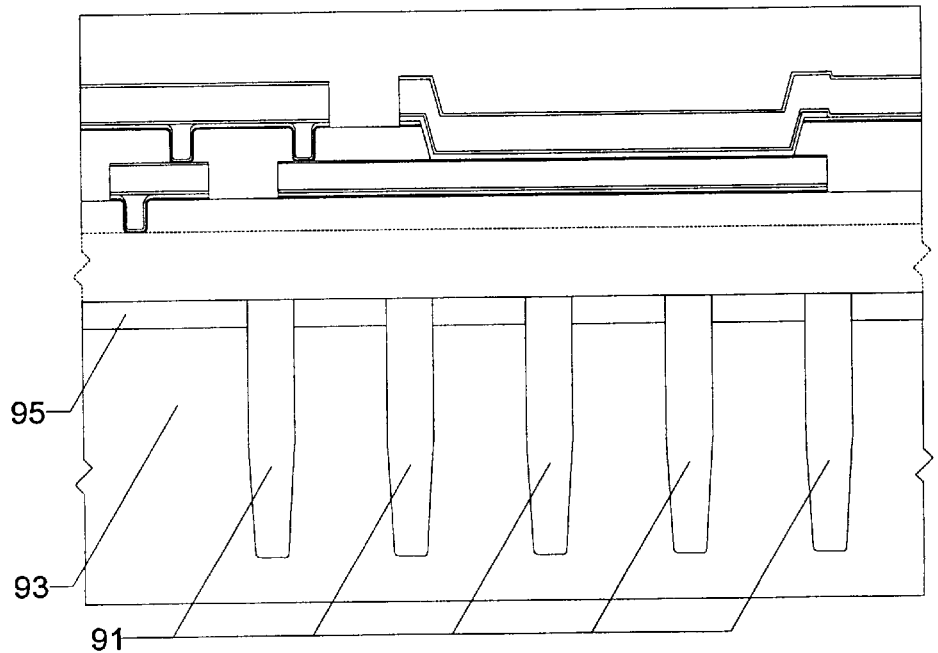

Deep ditches, so-called trenches 91, are formed in the monocrystalline silicon substrate 93, as shown in FIG. 6. These trenches 91, which should have a depth of the order of 5 μm, are preferably formed in a grid-like pattern under the capacitor. The trenches 91, the purpose of which is to shield the capacitor from the conducting silicon substrate 93 and consequently reduce the capacitive coupling, shall consist of an insulating or semi-insulating, material, such as e.g. silicon oxide or polysilicon.

The trenches 91 are advantageously manufactured through patterning of the lowest oxide layer 95 deposited on the substrate, followed by etching and filling in of the ditches. The filling takes place through deposition of silicon oxide or a combina-tion of silicon oxide and polysilicon, whereafter the resulting surface is planarized, i.e. surplus material from the deposition is removed with e.g. a dry etch.

A capacitor in an integrated circuit according to the present invention is reliable and has high performance. Through the use of plugged via holes 21 as electrical connection between the lower electrode 17 of the capacitor and above lying connection layer 43, a compact capacitor is achieved where the contact problem caused by e.g. bad step coverage for the metal is minimized. In this way a higher degree of functional circuits are achieved in the manufacturing process.

A capacitor according to the invention is especially suitable for radio and other high-frequency applications, where large requirements are put on low resistive losses and a low voltage dependency. This applies in particular when the capacitor is integrated as part of a resonator tank in a VCO (Voltage Controlled Oscillator) in order that the resonator tank should have a high Q-value, good frequency stability and low phase noise.

By etching holes 61, 65 in the electrodes 63, 67, so that they appear as a number of joined-together plates 64, 68, the electrodes 63, 67 can be made arbitrarily large, and consequently high and extremely high capacitances can be achieved without changing over to an unconventional choice of capacitor dielectric, which would considerably complicate the manufacturing process.

The manufacturing method preferably includes deposition of three-layer stacks 75, 41,77, 85,15, 87 for forming the conducting layers and electrodes and deposition of via barriers 71,73, 81, 83 in the via holes 21, 29 as described above. This contributes to a higher reliability.

Very low parasitic capacitances are achieved when the capacitor is manufactured high up in the layer structure of the integrated circuit. A conventional process includes 2–4 metal layers. Recent processes permit five-metal layers and the development is going towards still more. The capacitor is suitably placed between the two uppermost metal layers, where the coupling to the substrate is minimized and where there is also the possibility to form more space. Trenches or deep ditches 91 of insulating or semi-insulating material in the substrate 93, which shield the capacitor from the conducting substrate, further contribute to minimizing the parasitic capacitances.

The invention is naturally not limited to the embodiments described above and shown on the drawings, but can be modified within the scope of the appended claims. In particular, the invention is obviously not limited to that which concerns choice of material, dimensions or position of the capacitor in a multilayer structure.

What is claimed is:

1. A method for manufacturing a capacitor with metallic conducting electrodes during the manufacturing of an integrated circuit intended for preferably high-frequency applications comprising the steps of:
   a) depositing a first metal layer on a layer structure comprising lowermost a substrate and uppermost a first insulating layer to form a lower electrode;
   b) depositing a second insulating layer over the first metal layer;
   c) etching a via hole through said second insulating layer to provide an electrical connection path to said lower electrode;
   d) plugging said via hole with a conductive material;
   e) uncovering the first metal layer by etching the second insulating layer to form a capacitor opening;
   f) forming a capacitor dielectric in the capacitor opening by depositing a dielectric layer over the structure formed by steps a)–e), including patterning and etching said dielectric layer so that the capacitor dielectric overlaps said second insulating layer; and
   g) depositing a second metal layer on the structure formed by said steps a)–f) to form an upper electrode and a connecting layer; including patterning and etching said second metal layer so that the upper electrode overlaps said second insulating layer and so that the connecting layer overlaps the plugged via hole.

2. The method according to claim 1, wherein said step d) plugs the via hole with tungsten.

3. The method according to claim 1, further comprising a step h) of etching holes with a predetermined shape and in predetermined places in the upper and the lower electrodes as to form a plurality of capacitors.

4. The method according to claim 3, wherein said step h) of etching etches the capacitor connection holes so that desired adjacent lower or upper electrodes appear as joined-together plates.

5. The method according to claim 4, wherein the capacitor produced by each lower and upper electrode and interposed capacitor dielectric has a dimension of about 100×100 $\mu m^2$.

6. The method according to claim 1, wherein said step d) of plugging includes forming a via barrier on the insulating layer and in the via hole.

7. The method according to claim 6, wherein the via barrier is made of a laminate of titanium and titanium nitride.

8. The method according to claim 1, wherein at least one of the first metal layer deposited in step a) and second metal layer deposited in step g) are formed of a conductive core formed between thin electrically conducting layers deposited before and after the conductive core.

9. The method according to claim 8, wherein the thin electrically conducting layers are made of titanium nitride and that the conductive core is made of aluminum or an aluminum-copper alloy.

10. The method according to claim 1, further comprising a step i) of forming ditches or trenches so that the capacitor is electrically shielded from the substrate.

11. The method according to claim 10, wherein said step i) includes the substeps of etching ditches or trenches in said substrate and filling the ditches or trenches with silicon oxide or a combination of silicon oxide and polysilicon.

12. The method according to claim 10, wherein the trenches are formed to a depth of the order of 5 $\mu$m.

13. The method according to claim 1, wherein the second insulating layer deposited in said step b) is made of silicon oxide deposited to a thickness of approximately 1 $\mu$m.

14. The method according to claim 1, wherein the dielectric layer deposited in said step f) is deposited by means of either CVD-, PECVD- or SACVD-techniques.

15. The method according to claim 1, wherein the dielectric layer deposited in said step f) is deposited to a thickness of approximately 300–1000 Å.

16. The method according to claim 1, wherein the dielectric layer deposited in said step f) is made of silicon nitride.

17. The method according to claim 1, wherein the dielectric layer deposited in said step f) and the second metal layer deposited in said step g) overlap said second insulating by approximately 1000 Å.

18. The method according to claim 1, wherein the via hole is etched in said step c) so that its diameter or width is less than 1 $\mu$m.

* * * * *